United States Patent [19]

Neckers et al.

[11] Patent Number: 5,395,862
[45] Date of Patent: Mar. 7, 1995

[54] PHOTOOXIDIZABLE INITIATOR COMPOSITION AND PHOTOSENSITIVE MATERIALS CONTAINING THE SAME

[75] Inventors: Douglas C. Neckers, Perrysburg; Jianmin Shi, Bowling Green, both of Ohio

[73] Assignee: Spectra Group Limited, Inc., Maumee, Ohio

[21] Appl. No.: 988,189

[22] Filed: Dec. 9, 1992

[51] Int. Cl.$^6$ ............................................. C08F 2/46
[52] U.S. Cl. ............................................. 522/25; 522/67; 430/269
[58] Field of Search ..................... 522/67, 25; 430/269

[56] References Cited

U.S. PATENT DOCUMENTS

| | | | |
|---|---|---|---|
| 1,885,592 | 11/1932 | Corilthard et al. | 549/394 |
| 2,157,351 | 5/1939 | Schneider et al. | 540/1 |
| 2,875,047 | 2/1959 | Oster | 96/35 |
| 4,329,461 | 5/1982 | Khanna et al. | 544/375 |
| 4,439,356 | 3/1984 | Khanna | 525/420 |
| 4,481,136 | 11/1984 | Khanna et al. | 260/112 R |
| 4,492,762 | 1/1985 | Wang et al. | 436/800 |
| 4,552,830 | 11/1985 | Reardon et al. | 430/281 |
| 4,585,862 | 4/1986 | Wang et al. | 544/319 |
| 4,647,675 | 3/1987 | Mayer et al. | 549/394 |
| 4,694,029 | 9/1987 | Land | 522/25 |
| 4,716,097 | 12/1987 | Weed | 430/327 |
| 4,772,530 | 9/1988 | Gottschalk et al. | 430/138 |
| 4,988,607 | 1/1991 | Ali | 522/25 |
| 5,102,775 | 4/1992 | Okuhara | 522/25 |
| 5,137,800 | 8/1992 | Neckers et al. | 430/281 |

FOREIGN PATENT DOCUMENTS 515133 11/1992 European Pat. Off. .
1123767 8/1968 United Kingdom .
9010254 9/1990 WIPO .

OTHER PUBLICATIONS

CA107(25):228304r, "The Raising and Characterization . . ." Bennett, et al. 1987.
J. Org. Chem., vol. 57, "Xanthenes: Fluorone Derivatives . . . " Shi, et al. Jul 1992.
CA105: 80656t, "Novel Radical Couplings . . . ", Phillips, et al. 1986.
Shapovalov, "Study of Spectral . . .", CA, vol. 101, #8, p. 65, 101:56476f(84).
Phillips, "Novel Radical . . . ", JCS, Perkins Trans I (86) 671-673.
Amat. Guerri, "Synthesis . . . ", CA, vol. 112, #26, p. 80(90). Abstract No. 236887b.
Amat Guerri, "Singlet . . . ", J. of Photochem & Photobio, A: Chem., 53, 199–210(90).
Flossman, "Mechanism . . . ", CA, vol. 76, p. 398(72). Abstract #46433r.

*Primary Examiner*—Marion E. McCamish
*Assistant Examiner*—Mark A. Chapman
*Attorney, Agent, or Firm*—Thompson, Hine and Flory

[57] ABSTRACT

Disclosed is a photooxidizable initiator composition comprising a fluorone initiator and a coinitiator which is capable of accepting an electron from the fluorone upon excitation of the fluorone by actinic radiation, wherein the composition produces free radicals which initiate free radical reactions; and photohardenable compositions which comprise a free radical polymerizable compound, a fluorone initiator and a coinitiator capable of accepting an electron from the fluorone upon exposure of the composition to actinic radiation, and producing free radicals which initiate free radical polymerization.

20 Claims, 1 Drawing Sheet

PHOTOOXIDIZABLE INITIATOR COMPOSITION AND PHOTOSENSITIVE MATERIALS CONTAINING THE SAME

BACKGROUND OF THE INVENTION

The present invention relates to a novel photoinitiator composition, to photohardenable compositions containing the novel photoinitiator compositions, to photosensitive materials employing them, and to methods for two and three dimensional imaging using the same.

More particularly, the present invention relates to a novel photooxidizable initiator system which comprises a fluorone initiator and a coinitiator which is capable of accepting an electron from the fluorone upon exposure of the composition to actinic radiation and which is sensitive to visible light and which provides high depth of cure in the photohardenable composition.

The visible light photoinitiators used most commonly in industry are sensitive to ultraviolet and blue light but do not exhibit high sensitivity to wavelengths greater than about 450 nm and, more particularly, greater than about 500 nm. Most of these visible initiators are ketocoumarins, titanocenes, and others. Unfortunately, these photoinitiators are not useful with the least expensive radiation sources and particularly lasers which emit at longer wavelengths. The photoinitiators are insensitive at these wavelengths, other photoinitiators such as Eosin, Rose Bengal and the like are too slow for commercial applications. As a consequence, there is a need for more efficient initiators which are sensitive to longer wavelengths.

Many, if not the vast majority of conventional photoinitiators, also suffer from another disadvantage, namely, a limited depth of cure. The depth of cure of these photoinitiators is limited by Beers law, that is, the photoinitiator at the surface of a composition absorbs the activating radiation and limits the amount of radiation which can penetrate to greater depths within the composition and produce a complete cure beyond the surface layer. One means of improving depth of cure is to design photoinitiators which bleach as they absorb light and initiate polymerization. In this manner, as the surface layers are exposed and cured they transmit more radiation to the underlying layers enabling radiation to reach greater depths and increasing the depth of cure.

One example of a visible light sensitive photoinitiator is the cyanine borates described in U.S. Pat. No. 4,895,880.

In photoinitiated polymerizable processes, initiators play an important role in radiation absorption and the electron transfer sensitization step. In the most common scheme, certain initiators absorb radiation and form an excited initiator I* which is capable of accepting an electron from a suitable coinitiator which functions as an electron donor D. Reduction of the excited initiator I* produces the donor cation radical D+ which may be transformed into a free radical species R which is capable of initiating free radical polymerization. Free radical polymerization according to this scheme is called photoreductive initiated polymerization as illustrated in equations (1)–(4).

$$I \xrightarrow{h\nu} I^* \quad (1)$$

$$I^* + D \longrightarrow I^-\cdot + D^+. \quad (2)$$

$$D^+\cdot \longrightarrow R\cdot + N^+ \quad (3)$$

$$R\cdot + M \longrightarrow RM. \quad (4)$$

where $N^+$ is a positive species, $R\cdot$ is a free radical, and $M$ is the polymerizable monomer.

In another scheme, the excited initiator I* acts as an electron donor wherein an electron is given up by the excited initiator and transferred to a suitable coinitiator which functions as an electron acceptor A. Oxidation of I* produces the acceptor anion radical $A^-\cdot$ which in turn produces the negative species $N^-$ and the free radical $R\cdot$ which is then capable of initiating free radical polymerization. Free radical polymerization according to this scheme is referred to as photooxidative initiated polymerization as illustrated in equations (1')–(4').

$$I \xrightarrow{h\nu} I^* \quad (1')$$

$$I^* + A \longrightarrow I^+\cdot + A^-\cdot. \quad (2')$$

$$A^-\cdot \longrightarrow R\cdot + N^- \quad (3')$$

$$R\cdot + M \longrightarrow RM. \quad (4')$$

with respect to the electron transfer process, the initiator can function as an electron acceptor (reductive transfer) or as an electron donor (oxidative transfer) depending on the particular gegen ion employed as the coinitiator and, therefore, can initiate photoreductive or photooxidative polymerization.

Various compounds have been studied and disclosed as useful electron acceptors. For example, Toshihiro et al., *Photog. Sci. Eng.*, 18, 25 (1974) and "*Bull. Chem. Soc.*," Japan, Vol. 48, p. 3737 (1975) teach the use of diazonium salts as electron acceptors. Diazosulfones were employed as electron acceptors by G. A. Delzenne, et al. in British Pat. No. 1,277,029 and in *J. Photog. Sci.*, Vol. 22, p. 23 (1974). U.S. Pat. No. 4,257,915 to Eaton teaches the use of nitrohalomethanes as electron acceptors. Other compounds such as aryliodonium, sulfonium and phosphonium salts have been studied, for example, in U.S. Pat. Nos. 3,729,313 and 3,741,769, both to G. H. Smith.

SUMMARY OF THE INVENTION

Figure 1:
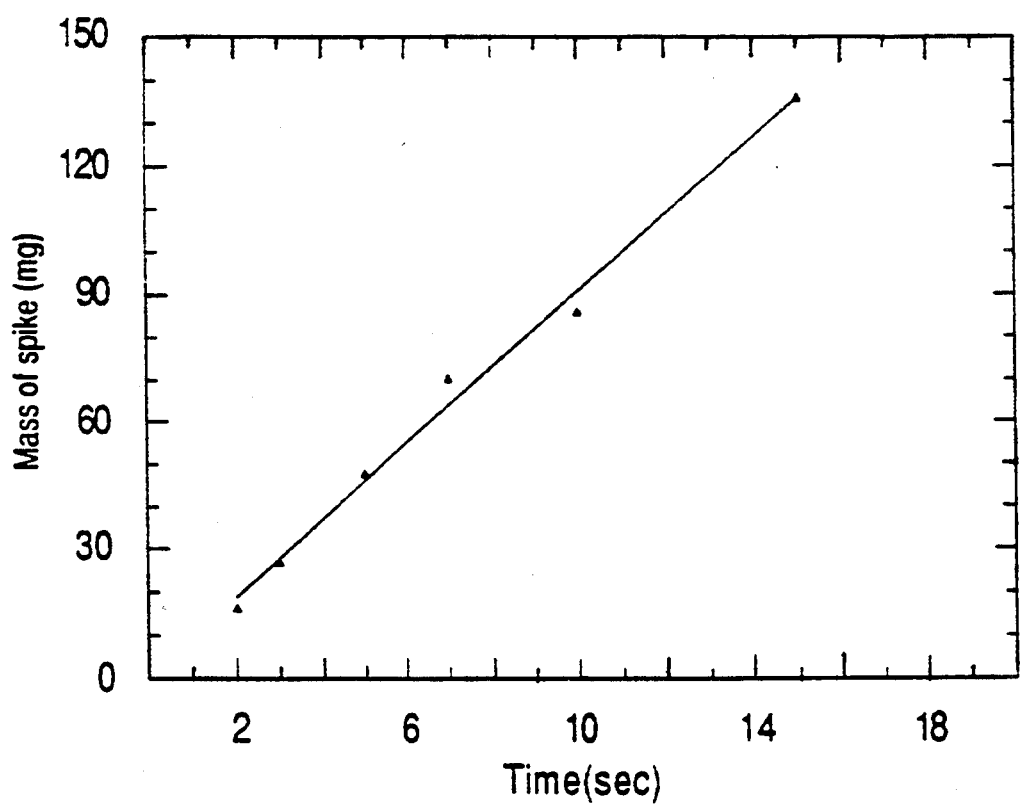
FIG. 1 is a graph of solid spike mass against radiation time for Example 6.

The present invention provides a photooxidizable initiator system which comprises a fluorone initiator and a coinitiator which is capable of accepting an electron from the excited fluorone species upon exposure of the initiator system to actinic radiation.

In accordance with the present invention, fluorones of the formulas (I) and (II) and their equivalents are useful as photoinitiators.

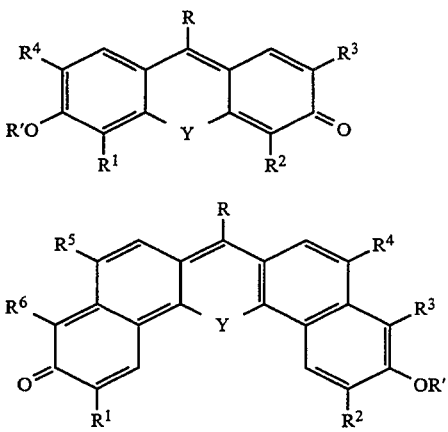

(I)

(II)

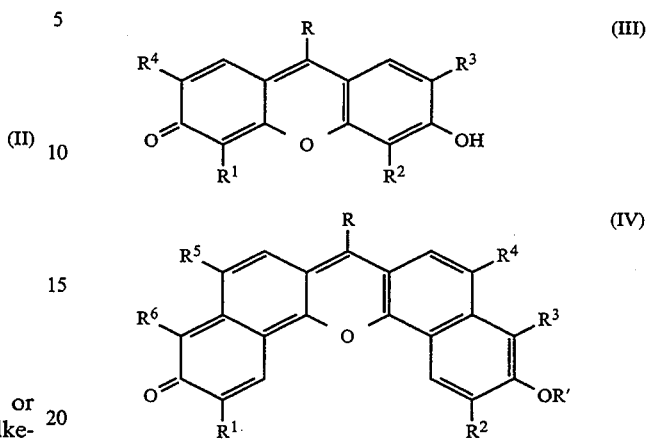

(III)

(IV)

where Y is oxygen, sulfur, selenium, tellurium or >C=O, and preferably oxygen; R is hydrogen, alkenyl, alkyl, alkynyl, or an electron withdrawing group (EWG) selected from the group consisting of quaternary amino, nitro, nitroso, cyano, —$SO_3R'$, —$SO_2R'$, halogen, trihalomethyl, —CHO, carbamoyl, sulfamoyl, sulfinyl, —COOR', COR", C(O)OCOR', NCS, and NCO where R' is hydrogen, alkyl, aryl, or aralkyl; $R^1$-$R^6$ are the same or different and represent a hydrogen atom, a halogen atom, alkyl, alkenyl, aryl, aralkyl, alkaryl, $SO_3R$, $SO_2R$, $SO_2NR_2$, $NO_2$, NCO, NCS, $(CH_2)_n$ NCO, $(CH_2)_nNCS$, CN, $(CH_2)_nCN$, $(CH_2)_nCOOR'$, $(CH_2)_nCONR_2$, $(CH_2)_nX$, or $(CH_2)_nNR_2$, provided that at least one of $R^1$-$R^6$ is a halogen atom; n is 1 to 6; $R^1$ and $R^2$ may combine to form a 10 to 12 membered ring; and R" is hydrogen, alkyl, aryl, aralkyl, N-imido such as N-succinimido and N-maleimido, or $NR_2$. When R" is N-imido or $NR_2$ the compounds are esters of N-hydroxyimides such as N-hydroxysuccinimides or N-hydroxyamines. Typically, $R^1$ and $R^2$ are the same, $R^3$ and $R^4$ are the same in formula (I), and $R^1$ and $R^2$ and $R^3$ and $R^6$ and $R^4$ and $R^5$ are the same in formula (II).

For use as a photoinitiator, $R^1$-$R^6$ preferably represent halogen atoms or a combination of halogen atoms and hydrogen atoms and more particularly iodine or bromine atoms or a combination of hydrogen and iodine or bromine atoms. These compounds are described in copending U.S. Application No. 07/772,103 filed Oct. 7, 1991 which is incorporated herein by reference to the extent necessary to define the fluorones and the synthesis thereof.

The photooxidizable initiator system further comprises a coinitiator which functions as an electron acceptor upon excitation of the fluorone. Useful coinitiators include onium salts, nitrohalomethanes, diazosulfones, etc. Particularly useful coinitiators are the onium salts such as iodonium salts, sulfonium salts, pyrylium salts, thiapyrylium salts, diazonium salts and ferrocenium salts.

The present invention also provides photohardenable compositions containing the aforementioned photoinitiators.

Another manifestation of the invention is a photosensitive material comprising a layer of the aforementioned photosensitive composition on a support.

Still other manifestations of the invention are processes for forming two- and three-dimensional images or models.

In accordance with the more preferred embodiments of the invention, the fluorones are represented by the formulas III and IV.

where R, R', and $R^1$-$R^6$ are defined as in formula (I).

Preferred photoinitiator systems in accordance with the present invention include 5,7-diiodo-3-methoxy-6-fluorone (DIMF), 5,7-diiodo-3-ethoxy-6-fluorone (DIEF), 2,4,5,7-tetraiodo-3-hydroxy-6-fluorone (TIHF), 2,4,5,7-tetrabromo-3-hydroxy-6-fluorone, 9-cyano-3-hydroxy-2,4,5,7-tetraiodo-6-fluorone (TIHCF), and 9-cyano-3-hydroxy-2,4,5,7-tetrabromo-3-hydroxy-6-fluorone (TBHCF) in combination with diphenyliodonium chloride as the coinitiator.

DETAILED DESCRIPTION OF THE INVENTION

With reference to formulas (I)-(IV) above, representative examples of alkenyl groups represented by R include 2 to 6 carbon atoms such as 1-propenyl, 1-butenyl, 1,3-butadienyl, etc. Examples of alkyl groups represented by R may contain 1 to 6 carbon atoms and be straight chain, branched or cyclic.

Representative examples of electron withdrawing groups represented by R include quaternary amino groups such as tetraalkylamino and, more particularly, tetramethylamino; halogen such as chlorine, bromine or iodine; trihalomethyl such as trifluoromethyl; nitro; nitroso; cyano; —$SO_2R'$ including —$SO_2H$; —$SO_3R'$ including —$SO_3H$; —CHO; carbamoyl, e.g., $CONR'_2$; sulfamoyl, e.g., $SO_2NR'_2$; COOR' where R' is hydrogen, an alkyl group having 1 to 4 carbon atoms, an aryl group such as a phenyl group or an aralkyl group such as a benzyl group.

Representative examples of alkyl groups represented by R and $R^1$-$R^6$ are straight chain, branched chain and cyclic alkyl groups having 1 to 10 carbon atoms such as methyl, ethyl, propyl, butyl, pentyl, hexyl, heptyl, etc.

Representative examples of aryl groups represented by $R^1$-$R^6$ include phenyl groups which may be unsubstituted or substituted by halogen, e.g., 2',3',4',5-tetrahalophenyl, alkyl, $(CH_2)_pCOOR$, $(CH_2)_pX$, or $(CH_2)_pNR_2$, where R and X are defined as above and p is 0 to 6.

Representative examples of aralkyl groups represented by $R^1$-$R^6$ include aralkyl groups containing 7 to 20 carbon atoms such as benzyl, phenethyl, etc.

Representative examples of alkaryl groups include alkaryl groups containing 7 to 20 carbon atoms such as phenyl substituted at the ortho or para position by a straight chain or branched chain alkyl group having 1 to 6 carbon atoms.

Representative examples of alkenyl groups represented by R or $R^1$-$R^4$ include alkenyl groups having 2 to 10 carbon atoms such as vinyl, allyl, 1-propenyl, 1-butenyl and 1,3-butadienyl.

Representative examples of alkynyl groups represented by R include alkynyl groups having up to 10 carbon atoms such as 1-propynyl, 1-butynyl, etc.

Representatives examples of the halogen atoms represented by X or $R^1$-$R^6$ include fluorine, chlorine, bromine and iodine and preferably fluorine or chlorine in the case of fluorescers and bromine or iodine in the case of photoinitiators.

When $R^1$ and $R^2$ of formula I combine to form a ring, one class of compounds in accordance with the invention can be represented by the formula V.

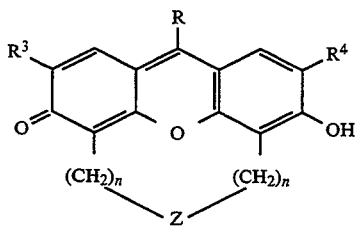

where R, $R^1$ and $R^2$ are defined as above, n is 2 or 3, and Z is NH, $NR^8$, O, $PR^8$, $CHR^8$ where $R^8$ has the same definition as $R^1$-$R^4$ but can be the same as or different than $R^1$-$R^4$ and may additionally represent dichlorotriazinyl.

For use as a photoinitiator, at least one of the $R^1$-$R^5$ must be halogen. Examples of halogen atoms represented by $R^1$-$R^6$ are chlorine, bromine and iodine. In one embodiment $R^1$-$R^6$ in formula (II) and $R^1$-$R^4$ in formula (I) are the same and represent bromine or iodine. In another embodiment $R^2$ and $R^3$ in formula (I) and $R^1$ and $R^6$ in formula (II) are halogen and the balance of $R^1$-$R^6$ are hydrogen.

The fluorone may be used in an amount of about 0.005 to 0.5% and preferably about 0.02 to 0.1% based on the weight of the monomer.

In accordance with the invention, the fluorone initiators are used in combination with a coinitiator which acts as an electron acceptor when the photooxidizable initiator system is exposed to actinic radiation. Coinitiators useful in the present invention can be selected from known electron accepting coinitiators. The electron transfer process between a photoinitiator and a coinitiator is the crucial step in the visible-light induced photopolymerization. The free energy ($\Delta G$) of this photosensitized electron transfer predicts the likelihood of the process. $\Delta G$ may be estimated from the oxidation ($E_{ox}$) and excitation ($E_p$) energies of the photosensitizer and the reductive energy of the coinitiator ($E_{red}$)

$$\Delta G = E_{ox} - E_p - E_{red}$$

The more negative $\Delta G$ for the reaction, the more likely it is that the reaction will exhibit relatively larger quantum yields of photolysis and a high relative polymerization rate. The $E_{ox}$ and $E_p$ for TIHF are 1.34 v and 1.86 v, respectively, so that the coinitiators with an $E_{red}$ larger than $-0.52$ will produce a positive $\Delta G$. These reactions might yield a slow electron transfer process between the fluorone and the coinitiator. The reaction might also fail. However, as $E_{red}$ increases, it is more likely that the reaction will be successful.

Particularly useful coinitiators are onium salts which include iodonium salts, sulfonium salts, thiapyrylium salts, diazonium salts, and ferrocenium salts. Potentially useful onium salts include: (i) triarylsulfonium hexafluorophosphates, triarylsulfonium arsenates and triarylsulfonium antimonates, (ii) diaryliodonium hexaflurophosphates, diaryliodonium arsenates and diaryliodonium antimonates, (iii) dialkylphenacylsulfonium tetrafluorophosphates, (iv) dialkyl-4-hydroxyphenylsulfonium tetrafluoroborates and dialkyl-4-hydroxyphenylsulfonium hexafluorophosphates. Representative examples of useful onium salts include diaryl iodonium salts such as $(Ph)_2I^+PF_6$, triarylsulfonium salts such as 4-(phenyl thio)phenyldiphenylsulfonium; sulfoxonium and carbamoylsulfoxonium salts, phenyldiazonium salts such as $ArN_2^+BF_4^-$ and thiapyrylium salts.

Where the onium salt is an iodonium salt it is preferably represented by the formula:

$$[R^5{}_a R^6{}_b I]^{+c} [MQ_d]^{-(d-e)} \qquad (VI)$$

where $R^5$ is a monovalent aromatic organic radical; $R^6$ is a divalent organic radical, M is a metal, such as antimony, iron, tin, bismuth, aluminum, gallium, indium, titanium, zirconium, scandium, vanadium, chromium, manganese, cerium, or rare earth elements, such as lanthanides and actinides, or a metaloid, such as carbon, nitrogen, phosphorus, boron, or arsenic, and Q is a halogen, alkyl, aryl, or alkyl, or equivalent radical, a and b are whole numbers equal to 0, 1 or 2, c is equal to (d-e), e is equal to the value of M and in an integer equal to 2 to 7 inclusive, and d is an integer of exp to 8.

Radicals included by $R^5$ can be the same or different aromatic, carbocyclic or heterocyclic radicals having from 6 to 20 carbon atoms, which can be substituted on the ring with from 1 to 4 monovalent radicals selected from $C_{(1-18)}$ alkoxy, $C_{(1-18)}$ alkyl, nitro, chloro, etc., $R^5$ is more particularly phenyl, chlorophenyl, nitrophenyl, methoxyphenyl, pyridyl, etc. Radicals included by $R^6$ are divalent radicals such as

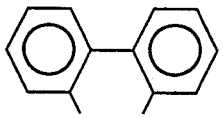

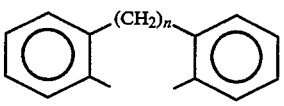

where n is 1-2, etc. Metal or metalloids included by M of formula (VI) are transition metals such as Sb, Fe, Sn, Bi, Al, Ga, In, Ti, Zr, Sc, V, Cr, Mn, Cs, rare earth elements such as the lanthanides, for example, Cd, Pr, Nd, etc., actinides, such as Th, Pa, U, Np, etc. and metalloids such as B, P, As, etc. Complex anions included by $MQ_d^{-(d-e)}$ are, for example, $BF_4^-$, $PF_6^-$, $AsF_6^-$, $SbF_6^-$, $FeCl_4^=$, $SnCl_6^-$, $SbCl_6^-$, $BiCl_3^-$, etc.

Halonium salts (especially iodonium salts) included by formula (VI) are, for example,

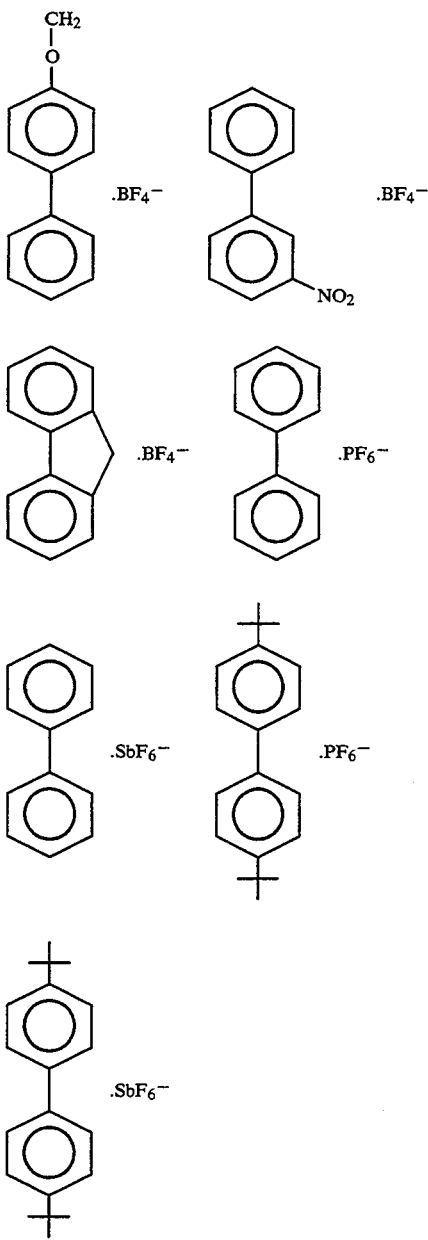

The halonium salts of formula (VI) can be made by the procedures described by O. A. Ptitsyna, M. E. Pudecva, et al., Dokl, Adad Nauk, SSSR, 163, 383 (1965); Dokl, Chem., 163, 671 (1965). F. M. Beringer, M. Drexler, E. M. Gindler, J. Am. Chem. Soc., 75, 2705 (1953). J. Collette, D. McGreer, R. Crawford, et al., J. Am. Chem. Soc. 78, 3819 (1956). Other aryliodonium salts include the polymeric iodonium salts which are described in U.S. Pat. No. 4,780,511 and are hereby incorporated by reference.

Particularly preferred iodonium salts of formula (VI) include salts having the following structures: $C_nH_{2n+1}C_6H_4I^+(C_6H_5)$, $(C_nH_{2n+1}C_6H_4)_2 I^+$, $(C_nH_{2n+1}OC_6H_4)I^+(C_6H_5)$ and $(C_nH_{2n+1}OC_6H_4)_2I^+$ where n=8 to 12.

Particularly preferred iodonium salts are the aryliodonium salts, and most preferably, the diaryliodonium salts such diphenyliodonium chloride, diphenyliodonium iodide, diphenyliodonium bromide, and the like.

Where the onium salt is a sulfonium salt, it is preferably of the formula:

$$[R^7_fR^8_gR^9_hS]^+[or\ Q_n]^- \qquad (VII)$$

where $R^7$ is a monovalent aromatic organic radical; $R^8$ is a monovalent aliphatic radical such as an alkyl radical, $R^9$ is a polyvalent organic radical forming a heterocyclic or forced ring structure; M is a metal or metaloid as defined above with respect to the iodonium salts; Q is a halogen or other radical as defined above with respect to the iodonium salt; f is a whole number equal to 0 to 3 inclusive; g is a whole number equal to 0 to 2 inclusive; h is a whole number equal to 0 or 1; and the sum of f, g and h is equal to 1 to 3 inclusive; and n is an integer equal to 4 to 6 inclusive.

Examples of sulfonium salts potentially useful in the present invention include 4-(phenylthio)phenyldiphenyl sulfonium salts. Other examples of triarylsulfonium salts include:

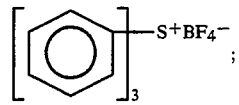

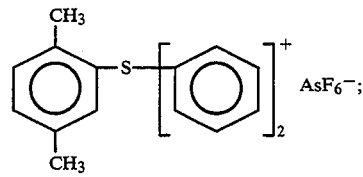

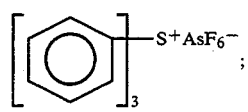

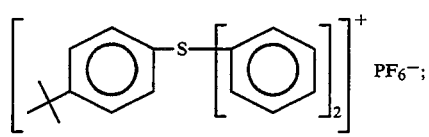

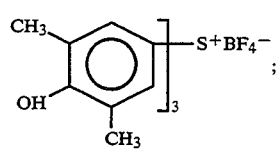

and

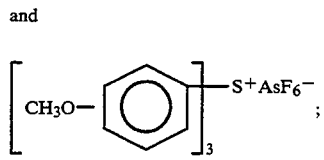

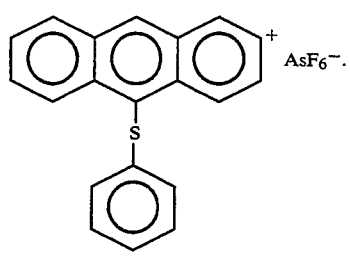

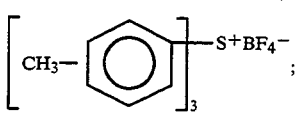

Other sulfonium salts include

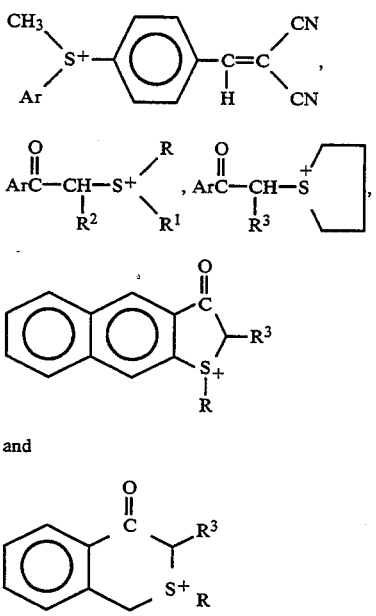

and where R, R[1], R[2], R[3] represent alkyl, aryl, aklaryl, heterocyclic, etc.; Ar is an aryl group including one or more fused aromatic rings and R[3] may be hydrogen.

In addition, ferrocenium salts of formula

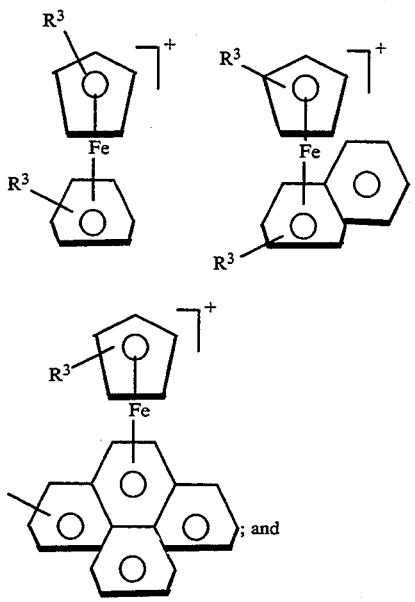

diazonium salts of formula:

ArNo$_2^+$ where Ar is as defined above are useful. The salts listed above are examples from which useful salts may be selected. Generally, the difference between their reduction potential and the oxidation potential of the dye radical should be at least 0.2 V. and the composition must be dark stable.

The coinitiator may be used in an amount of about 0.01 to 2.5% based on the weight of monomer.

The most typical example of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Generally, any unsaturated compound which is convertible to a solid by free radical polymerization is useful herein. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetramethacrylate, dipentaerythritol hydroxypentacrylate (DPHPA), hexanediol-1,6-dimethacrylate, hexanediol diacrylate, diethyleneglycol dimethacrylate, diglycidyl ether diacrylate (MW=390), trimethylol propane ethoxylate triacrylate, neopentyl glycol propoxylate diacrylate (MW=428). Other vinyl compounds such as N-vinyl pyrrolidone (NVP) are also useful. The monomers may be selected and blended to provide the optimum photographic speed and/or the physical characteristics desired in the product. Monomer selection and blending may also be used to insure adequate solubility of the photoinitiators. A particularly preferred monomer composition is 87% DPHPA and 13% NVP. Another preferred composition is TMPTA, DPHPA and NVP.

It may be desirable to incorporate a sensitizer in the compositions of the present invention to control the sensitivity of the composition and/or to extend its sensitivity. Useful sensitizers include those known in the art such as anthracene, and its derivatives naphthalene, acetophenone, benzophenone, 2-acetonaphthone, etc.

Solvents may be necessary to dissolve the photoinitiator if the photoinitiator is not sufficiently soluble in the monomer. Solvents may also be used to shift the absorption spectrum to tune the sensitivity of the composition. Some examples of useful solvents are N-vinylpyrrolidone (NVP), nitrobenzene. amd dimethyl formamide (DMF). Other useful solvents can be identified readily.

The nature of the monomer, the amount of the fluorone and coinitiator in photohardenable compositions in accordance with the present invention will vary with the particular use of the compositions, the emission characteristics of the exposure sources, the development procedures, the physical properties desired in the polymerized product and other factors. With this understanding, compositions in accordance with the invention will generally fall within the following compositional ranges in parts by weight (based on 100 parts total).

| Polymerizable compound | 50 to 99.7 |
|---|---|
| Fluorone | .02 to .05 |
| Electron Acceptor | 0.2 to 1 |

-continued

| | |
|---|---|
| Autooxidizer | 0 to 3 |
| Sensitizer (optional) | 0.3 to 1 |

Compositions in accordance with the invention more typically are anticipated to have the following formulation:

| | |
|---|---|
| Polymerizable compound | 10 g |
| Fluorone | 2 mg to 10 mg |
| Electron Acceptor | 20 mg to 100 mg |
| Autooxidizer | 0 to 3 g |
| Sensitizer (optional) | 20 mg to 100 mg |

The photohardenable compositions of the present invention can be coated upon a support in a conventional manner and used in making a photoresist or in photolithography to form an oleophilic polymer image. Development of photohardenable compositions in accordance with the invention is conducted in an otherwise known or conventional manner, e.g., a solvent for the unpolymerized monomer may be used to remove the photohardenable composition in the exposed areas.

The compositions of the invention can also be encapsulated as described in U.S. Pat. Nos. 4,399,209 and 4,440,846 and used to control the release of an image-forming agent. The latter processes typically involve image-wise exposing the photosensitive layer to actinic radiation and subjecting the layer of microcapsules to a uniform rupturing force such as pressure.

The photohardenable composition of the invention are also advantageous for use in the three dimensional modeling process taught in U.S. Pat. 4,575,330 to Hull. Due to the thicker depth of cure that is possible, models may be prepared in larger cross-sectional increments. This should reduce the total time required for the model building process. Another advantage which the claimed compounds bring to three dimensional modeling is higher green strength.

Generally, fluorones in accordance with the invention absorb at about 500 to 550 nm. It is anticipated that sensitivity can be extended to longer wavelengths by substituting electron withdrawing groups for R. Depending upon the extinction coefficient, compositions and photosensitive materials in accordance with the invention can be exposed to any source which emits in this range and particularly an He/Cd laser, or mercury arc lamps.

The invention also includes the use of the photooxidizable initiator compositions of the present invention in dosimeters and more particularly in dosimeters useful in detecting UV, visible and infrared laser pulses. Because the present photooxidizable initiator compositions undergo a color change (bleaching) when exposed to radiation, they may be used to record and provide a quantitative indication of exposure to actinic radiation. For this purpose, they may be dispersed in a compatible binder such as polyvinyl alcohol or polymethyl methacrylate and coated upon a support. When the color change alone is not suitable for use in dosimetry, the photohardenable compositions described above may be useful. Exposure of the compositions produces a change which is indicative of the type or amount of exposure.

In the table below, the properties of the foregoing initiators are shown:

| Compound | λmax[a] | λf[b] | φf | pK$_a$ | E$_{ox}$ | E$_{red}$ | λphos |
|---|---|---|---|---|---|---|---|
| TIHF | 532,536 | 544,548 | 0.13 | 4.08 | 1.34 | −0.99 | 676 |
| DIEF | 470,470 | -,539 | 0.0038 | — | — | −0.7 | — |
| TIHCF | 630,638 | -,654 | 0.02 | — | — | −0.57 | 777 |

The entry in the table is in the solvents according to the following order.
a. MeOH, EtOH
b. MeOH, EtOH

SYNTHESIS EXAMPLE 1

2,4,5,7-Tetraiodo-3-hydroxy-6-fluorone (TIHF)

Iodic acid (16.4 g, 93 mmol) dissolved in a minimum amount of water (app. 1 ml per gram) was added dropwise over 20 min. to a solution of 10 g (46.7 mmol) of 3,6-dihydroxyxanthene and 29.8 g (118 mmol) of iodine in 1 L of absolute ethanol. This mixture was stirred over two hours during which the dark brown solution slowly turned a red orange as the solid initiator precipitated. The mixture was then warmed for an hour at 60° C. After cooling, the mixture was filtered, washed with water and ethanol and the crude solid tritiated with absolute ethanol and refiltered to give, after drying under vacuum, 29 g (87%) of a red solid (λ=536 nm in ethanol) H$^1$ NMR (DMSO) 8.31 (s, 2H), 8.07 (S, 1H).

SYNTHESIS EXAMPLE 2

2,4,5,7-Tetraiodo-9-cyano-3-hydroxy-6-fluorone (TIHCF)

Potassium cyanide (1.175 g, 18.0 mmol) was added to a solution of TIHF (10.74 g. 115.0 mmol) in 100 ml of DMF. The reaction was monitored by its visible spectrum until all of the TIHF was consumed. The solvent was removed with a vacuum pump at room temperature and the residue was treated with 1:1 hexane/dichloromethane. The precipitate was filtered, dried and treated with 18% HCl then washed with water. 2,4,5,7-tetraIodo-9-cyano-3-hydroxy-6-fluorone (10.60 gh) was obtained (875). HNMR (DMSO):8.006(2H, s) max(ElOH=638 nm.

SYNTHESIS EXAMPLE 3

5,7-Diiodo-3-ethoxy-6-fluorone (DIEF)

To a solution of 12.1 g (50.0 mmol) of 3-hydroxy-6-ethoxyxanthane and 12.7 g (100.0 mmol) of iodine in 400 ml EtOH, 8.8 g (50.0 mmol) of iodic acid in 5.0 ml of water is added dropwise with stirring at 0° C. Precipate was formed immediately and the reaction mixture is stirred overnight at room temperature. It is then warmed to 50° C. for 45 minutes. Filtration and washing with ethanol and water yields 24.0 g (98.4%) of orange solid. $^1$HNMR (DMSO)δ: 8.48 (s, 1 H) , 8.37 (s, 1 H), 7.88 (d, 1 H, J=8.78 Hz), 7.18 (d, 1 H, J=2.26 Hz), 7.10 (dd, 1 H, J=2.34, 8.86 Hz), 4.27 (q, 2H, J=7.02 Hz) , 1.39 (t, 3 H, J=6.90 Hz).

EXAMPLE 4

The following compositions were prepared:
Composition 1 2,4,5,7-Tetraiodo-3-hydroxy-6-fluorone (TIHF) 1.4 mg in 1 g Polyethylene Glycol 400 Diacrylate monomer (PEGA) Diphenyliodonium Chloride 64 mg in 2 g PEGA Trimethylolpropane Triacrylate (TMPTA) 3.5 g Dipentaerythritol Hydroxypentaacrylate (DPHPA) 3.5g Composition 2 2,4,5,7-Tetraiodo-9-cyano-3-hydroxy-6-fluorone (TIHCF) 1.5 mg in 1 g Polyethylene Glycol 400 diacrylate Monomer (PEGA) Diphenyliodonium Chloride 64 mg in 2 g PEGA Trimethylolpropane Triacrylate (TMPTA) 3.5 g Dipentaerythritol Hydroxypentaacrylate (DPHPA) 3.5 g Composition 3 5,7-Diiodo-3-ethoxy-6-fluorone (DIEF) 1.0 mg in g Polyethylene Glycol 400 Diacrylate Monomer (PEGA) Diphenyliodonium Chloride 64 mg in 2 g PEGA Trimethylolpropane Triacrylate (TMPTA) 3.5 g Dipentaerythritol Hydroxypentaacrylate (DPHPA) 3.5g Results Each of the three compositions was placed in a test tube and exposed to a broad band light source. The compositions all cured rapidly.

EXAMPLE 5

Photooxidative bleachings of the initiator by diphenyliodonium chloride was studied spectrophotometrically in ethyl alcohol. Samples were irradiated at 514 mm by Spectra Physics 2016 argon ion laser or at 632 mm by Melles Griot helium-neon laser. The laser beam was expanded to form a circle of 11 mm diameter; the power delivered was measured with a Sciencetech 365 powermeter and all the absorption spectra were recorded on a Hewlett-Packard 8452A diode array spectrophotometer.

Irradiation of the initiators in ethanol solution ($1 \times 10^{-5}$M) alone for 15 minutes at a given wave length produced no change in the absorption spectrum while irradiation of the initiators in the presence of diphenyliodonium chloride ($1 \times 10^{-3}$M) resulted in rapid bleaching of the initiators.

The rate of photobleaching was determined in each sample by the decrease in the main absorption peak of the initiator, and the rate calculated from the equation $BR=(A_0-A_t)/A_0(min)$, where $A_0$ is the absorption intensity of the main peak before irradiation and $A_t$ in the absorption intensity of the main peak after irradiation time t. The results are shown in Table 1.

TABLE 1

| | Photobleaching Rate in Ethanol | | | | |
|---|---|---|---|---|---|
| Initiator conc. ($10^{-5}$ M) | Iodonium salt conc. $10^{-3}$ M | Excited wavelength (nm) | power (mw/cm2) | Observed wavelength (nm) | Bleaching rate (min.) |
| TIHF 1.02 | 1.01 | 514 | 63.6 | 536 | 0.694 |
| DIEF 1.00 | 1.01 | 514 | 63.6 | 470 | 10.62 |
| TIHCF 1.03 | 1.01 | 632 | 14.5 | 638 | 0.422 |

The bleaching rates are dependent on laser intensity and irradiation time. For the three initiators studied, the bleaching rates decrease in the order: DIEF>TIHF>TIHCF. The results indicate that the rate of bleaching for DIEF is over ten times faster than for TIHF and TIHCF.

EXAMPLE 6

Photopolymerization in thick samples is similar to known applications in three-dimensional imaging systems. Owing to the bleaching of the initiator during the laser irradiation time, polymerization may occur at depth as well as the surface whereby a solid polymeric spike is generated which extends from the point at which the laser impinges the surface depthwise into the polymerizable composition. The dimensions of the spike depend on the irradiation time and laser intensity. The rate of polymerization can be calculated by isolating the spike formed and measuring its weight.

In this Example, sample solutions were prepared and placed in glass fluorescence cuvettes. In preparing the samples, the initiator concentration and the diphenyliodonium chloride concentration were kept around $2 \times 10^{-4}$M and $2 \times 10^{-2}$M, respectively. The compositions were prepared as in Example 4.

All compounds were mixed homogeneously in a sonicator before irradiation. The samples were then irradiated at 514 mm by an argon ion laser or at 632 mm by a helium-neon laser. The beam diameter was 1.1 mm. The laser power was 5.26 and 1.49 w/cm, respectively. The spikes formed were isolated, washed with acetone and dried until a constant weight was obtained.

FIG. 1 shows a plot of the spike mass against irradiation time for Composition 3. The slope of the line gives a value of 8.97 mg/sec. as the rate of polymerization. The rates of polymerization for Compositions 1, 2 and 3 of Example 4 are shown in Table 2.

TABLE 2

| | Rate of Polymerization | | | |
|---|---|---|---|---|
| Initiator | Rate (mg/s) | λ | power (w/cm$^2$) | spike hardness* |
| DIEF | 8.97 | 514 nm | 5.26 | soft |
| TIHF | 4.26 | 514 nm | 5.26 | very soft |
| TIHCF | 1.14 | 632 nm | 1.49 | soft |

The results show that the initiators, in the presence of diphenyliodonium chloride as the electron acceptor, are suitable to initiate photooxidizable polymerization of 35% TMPTA, 35% DPHPA and 30% PEGA in thick samples. As shown in Table 2, the polymerization rates decrease in the order: DIEF>TIHF>TIHCF. However, it was observed that the spikes formed were soft indicating that the application may be limited. It was also noted that the solubility of diphenyliodonium chloride limited the use of higher concentrations of the salt.

EXAMPLE 7

The degree of photopolymerization is measured in thin samples based on the decrease in the number of the double bonds with irradiation time as well as the light intensity. The composition of the sample solution is the same as that used in Example 6 for the thick sample. A drop of the sample solution is placed between two sodium chloride plates with a thickness of 0.015 mm using a Teflon film as a spacer. The laser beam diameter is 11 mm and its intensity of laser power is 63.6 mw/cm$^2$ at 514 nm and 14.5 mw/cm$^2$ at 632 nm. The intensities of the double bond absorption at 810 cm$^{-1}$ are recorded before and after laser irradiation using Mattson Instruments Inc., 6020 Galaxy Series FTIR spectroscopy. The results are shown on Table 3. The data in parenthesis is the average percentage for per second.

TABLE 3

| Initiator | Degree of Polymerization Time (Sec) | | | | | | |
|---|---|---|---|---|---|---|---|
| | 10 | 15 | 20 | 30 | 40 | 45 | 60 |
| DIEF | 5.64 (.564) | | 7.92 (.396) | 9.87 (.329) | 12.87 (.322) | | |
| TIHF | | 4.95 (.330) | | 7.53 (.251) | | 13.27 (.295) | 16.83 (.281) |
| TIHCF | | 2.35 (.157) | | 4.16 (.139) | | 5.62 (.125) | 7.14 (.119) |

In addition to being useful in photosensitive materials, the compositions of the present invention are also useful in a wide variety of other applications including photocurable inks and coatings, photoadhesives, printing plates, photoresists, printed circuit fabrication, and other applications for photohardenable compositions.

While the invention has thus far been described with regard to photooxidizable initiated free radical polymerizable compositions, it is anticipated that the fluorones described herein are also useful in ionically polymerizable compositions and more particularly cationically polymerizable compositions.

Having described the invention in detail and by reference to preferred embodiments thereof, it will be apparent that modifications and variations are possible without departing from the scope of the invention defined in the appended claims.

What is claimed is:

1. A photohardenable composition comprising a free radical polymerizable compound, a halogen substituted fluorone represented by the formulas (I) or (II)

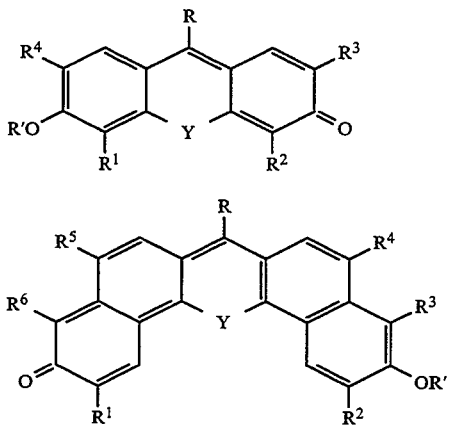

where Y is oxygen, sulfur, selenium, tellurium, or >C=O, R is hydrogen, alkenyl, alkyl, alkynyl or an electron withdrawing group selected from the group consisting of quaternary amino, nitro, nitroso, cyano, —$SO_3R'$, —$SO_2R'$, halogen, trihalomethyl, —CHO, carbamoyl, sulfamoyl, sulfinyl, —COOR' COR", —C(O)OCOR', NCS and NCO where R' is hydrogen, alkyl, aryl, or aralkyl; and $R^1$-$R^6$ are the same or different and represent a hydrogen atom, a halogen atom, alkyl, alkenyl, aryl, aralkyl, alkaryl, $SO_3R$, $SO_2R$, $SO_2$, NRS, $NO_2$, NCO, NCS $(CH_2)_nNCO$, $(CH_2)_n$ NCS, CN, $(CH_2)_nCN$, $(CH_2)_nCOOR'$, $(CH_2)_nCONR_2$, $(CH_2)_nX$, or $(CH_2)_nNR_2$, provided that at least one of $R^1$-$R^6$ is a halogen atom; n is 1 to 6; $R^1$ and $R^2$ may combine to form a 10 to 12 membered ring; and R" is hydrogen, alkyl, aryl, aralkyl, N-imido, or $NR^2$; and a coinitator selected from the group consisting of nitrohalomethanes, diazosulfones, onium salts, ferrocenium salts and thiapyrylium salts, said coinitiator capable of accepting an electron from said flurone upon exposure of said composition to actinic radiation and producing free radicals which initiate free radical polymerization or crosslinking of said free radical polymerizable or crosslinkable compound.

2. The photohardenable composition of claim 1 wherein said fluorone has the structure:

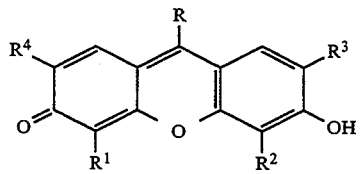

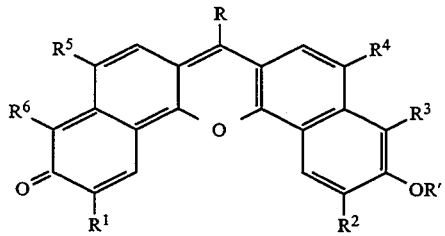

wherein R is hydrogen, alkenyl, alkyl, alkynyl or an electron withdrawing group selected from the group consisting of quaternary amino, nitro, nitroso, cyano, —$SO_3R'$, —$SO_2R'$, halogen, trihalomethyl, —CHO, carbamoyl, sulfamoyl, sulfinyl, —COOR' COR", —C(O)OCOR', NCS and NCO where R' is hydrogen, alkyl, aryl, or aralkyl; and $R^1$-$R^6$ are the same or different and represent a hydrogen atom, a halogen atom, alkyl, alkenyl, aryl, aralkyl, alkaryl, SOAR, $SO_2R$, $SO_2$, NRS, $NO_2$, NCO, NCS $(CH_2)_nNCO$, $(CH_2)_nNCS$, CN, $(CH_2)_nCN$, $(CH_2)_nCOOR'$, $(CH_2)_nCONR_2$, $(CH_2)_nX$, or $(CH_2)_nNR_2$, provided that at least one of $R^1$-$R^6$ is a halogen atom; n is 1 to 6; $R^1$ and $R^2$ may combine to form a 10 to 12 membered ring; and R" is hydrogen, alkyl, aryl, aralkyl, N-imido, or $NR_2$.

3. The photohardenable composition of claim 2 wherein said fluorone is 2,4,5,7-tetraiodo-3-hydroxy-6-fluorone.

4. The photohardenable composition of claim 2 wherein said fluorone is 2,4,5,7-tetraiodo-9-cyano-3-hydroxy-6-fluorone.

5. The photohardenable composition of claim 2 wherein said fluorone is 5,7-diiodo-3-ethoxy-6-fluorone.

6. The photohardenable composition of claim 2 wherein said coinitiator is an onium salt.

7. The photohardenable composition of claim 6 wherein said onium salt is diphenyliodonium chloride.

8. The photohardenable composition of claim 1 wherein said composition is encapsulated.

9. The photohardenable composition of claim 1 wherein said free radical polymerization of said free radical polymerizable compound occurs in 3-dimensional X,Y and Z planes.

10. The photohardenable composition of claim 1 wherein said free radical polymerizable compound is a mixture of dipentaerythritol hydroxpentacrylate and N-vinyl pyrrolidone or trimethylolpropane triacrylate, dipentaerythritol hydroxypentacrylate and N-vinyl pyrrolidone.

11. A photosensitive material comprising a support having a layer of photohardenable composition on the surface thereof, said photohardenable composition comprising a free radical polymerizable compound, a halogen substituted fluorone represented by the formula (I) or (II), where Y is oxygen, sulfur, selenium, tellurium, or <C=O, R is hydrogen, alkenyl, alkyl, alkynyl or an electron withdrawing group selected from the group consisting of quaternary amino, nitro, nitroso, cyano, —SO$_3$R', —SO$_2$R', halogen, trihalomethyl, —CHO, carbamoyl, sulfamoyl, sulfinyl, —COOR' COR", —(O)OCOR', NCS and NCO where R' is hydrogen, alkyl, aryl, or aralkyl; and R$^1$–R$^6$ are the same or different and represent a hydrogen atom, a halogen atom, alkyl, alkenyl, aryl, aralkyl, alkaryl, SO$_3$R, SO$_2$R, SO$_2$, NRS, NO$_2$, NCO, NCS (CH$_2$)$_n$NCO, (CH$_2$)$_n$NCS, CN, (CH$_2$)$_n$CN, (CH$_2$)$_n$COOR', (CH$_2$)$_n$CONR$_2$, (CH$_2$)$_n$X, or (CH$_2$)$_n$NR$_2$, provided that at least one of R$^1$–R$^6$ is a halogen atom; n is 1 to 6; R$^1$ and R$^2$ may combine to form a 10 to 12 membered ring; and R" is hydrogen, alkyl, aryl, aralkyl, N-imido, or NR$_2$; and a coinitiator selected from the group consisting of nitrohalomethane, diazosulfone, onium salts, ferrocenium salts and thiapyrylium salts, said coinitiator being capable of accepting an electron from said fluorone upon exposure of said composition to actinic radiation and producing free radicals which initiate free radical polymerization or crosslinking of said free radical polymerizable or crosslinkable compound.

12. The photosensitive material of claim 11 wherein said fluorone has the structure:

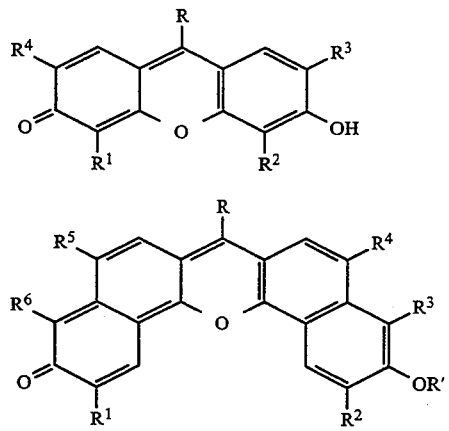

wherein R is hydrogen, alkenyl, alkyl, alkynyl or an electron withdrawing group selected from the group consisting of quaternary amino, nitro, nitroso, cyano, —SO$_3$R', —SO$_2$R', halogen, trihalomethyl, —CHO, carbamoyl, sulfamoyl, sulfinyl, —COOR', COR", —C-(O)OCOR', NCS and NCO where R' is hydrogen, alkyl, aryl, or aralkyl; and R$^1$–R$^6$ are the same or different and represent a hydrogen atom, a halogen atom, alkyl, alkenyl, aryl, aralkyl, alkaryl, SO$_3$R, SO$_2$R, SO$_2$, NRS, NO$_2$, NCO, NCS (CH$_2$)$_n$NCS, CN, (CH$_2$)$_n$CN, (CH$_2$)$_n$COOR', (CH$_2$)$_n$CONR$_2$, (CH$_2$)$_n$X, or (CH$_2$)$_n$NR$_2$, provided that at least one of R$^1$–R$^6$ is a halogen atom; n is 1 to 6; R$^1$ and R$^2$ may combine to form a 10 to 12 membered ring; and R" is hydrogen, alkyl, aryl, aralkyl, N-imido, or NR$_2$.

13. The photosensitive material of claim 12 wherein said fluorone is 2,4,5,7-tetraiodo-3-hydroxy-6-fluorone.

14. The photosensitive material of claim 12 wherein said fluorone is 2,4,5,7-tetriodo-9-cyano-3-hydroxy-6-fluorone.

15. The photosensitive material of claim 12 wherein said fluorone is 5,7-diiodo-3-ethoxy-6-fluorone.

16. The photosensitive material of claim 12 wherein said coinitiator is an onium salt.

17. The photosensitive material of claim 16 wherein said onium salt is diphenyliodonium chloride.

18. The photosensitive material of claim 11 wherein said free radical polymerizable compound is a mixture of dipentaerythritol hydroxypentacrylate and N-vinyl pyrolidone or trimethylolpropane triacrylate, dipentaerythritol hydroxpentacrylate and N-vinyl pyrrolidone.

19. The photosensitive material of claim 11 wherein said photohardenable composition is encapsulated.

20. The photosensitive material of claim 11 wherein said free radical polymerizable of said free radical polymerizable compound occurs in 3-dimensional X,Y and Z planes.

* * * * *

UNITED STATES PATENT AND TRADEMARK OFFICE
CERTIFICATE OF CORRECTION

PATENT NO. : 5,395,862
DATED : March 7, 1995
INVENTOR(S) : Douglas C. Neckers and Jianmin Shi It is certified that error appears in the above-identified patent and that said Letters Patent is hereby corrected as shown below:

CLAIM 1: Line 66, Col. 15, "$NR^2$" should be --$NR_2$--.

CLAIM 2: Line 48, Col. 16, "SOAR" should be --$SO_3R$--.

CLAIM 11: Line 24, Col. 17, "<C=O" SHOULD BE -->C=O--;
AND
Line 30, Col. 17, "-(O)OCOR'" should be -- -C(O)OCOR' --.

Signed and Sealed this

Fourth Day of July, 1995

BRUCE LEHMAN

Attest:

Attesting Officer    Commissioner of Patents and Trademarks